United States Patent [19]

Inokuti et al.

[11] Patent Number: 4,863,581
[45] Date of Patent: Sep. 5, 1989

[54] HOLLOW CATHODE GUN AND DEPOSITION DEVICE FOR ION PLATING PROCESS

[75] Inventors: Yukio Inokuti, Chiba; Osamu Ohkubo, Takaza, both of Japan

[73] Assignee: Kawasaki Steel Corp., Japan

[21] Appl. No.: 152,043

[22] Filed: Feb. 4, 1988

[30] Foreign Application Priority Data

Feb. 12, 1987 [JP] Japan ................................ 62-28369
Jul. 15, 1987 [JP] Japan ................................ 62-174778

[51] Int. Cl.$^4$ ........................ C23C 14/00; B23K 9/00
[52] U.S. Cl. ............................... 204/298; 204/192.31;
219/121.5; 219/121.52; 118/723; 118/726
[58] Field of Search ...................... 219/121.48, 121.50,
219/121.52; 204/192.31, 298, 289 PI, 298 ME;
118/7.22, 726, 723

[56] References Cited

U.S. PATENT DOCUMENTS

| | | | |
|---|---|---|---|
| 3,437,734 | 4/1969 | Roman et al. | 204/192.31 X |
| 3,486,064 | 12/1969 | Stauffer | 219/121.27 X |
| 3,491,015 | 1/1970 | Naff | 204/192.31 X |
| 3,984,581 | 10/1976 | Dobler et al. | 204/192.31 X |
| 4,147,916 | 4/1979 | Fairbairn | 219/121.5 X |
| 4,407,712 | 10/1983 | Henshaw et al. | 204/192.31 X |
| 4,415,421 | 11/1983 | Sasanuma | 204/298 X |
| 4,461,689 | 7/1984 | Diepers | 204/192.31 |
| 4,481,636 | 11/1984 | Curr et al. | 219/121.5 X |
| 4,659,899 | 4/1987 | Nelkie et al. | 206/192.31 X |

Primary Examiner—Nam X. Nguyen
Attorney, Agent, or Firm—Austin R. Miller

[57] ABSTRACT

A hollow cathode gun used in ion plating through the HCD process comprises a hollow cathode consisting of an outer graphite layer and an inner Ta, W or $LaB_6$ layer. The deposition device hollow comprises at least one crucible housing an evaporation material, a substrate and a reaction gas inlet, and is provided with a focusing coil surrounding the outer layer of the hollow cathode and another focusing coil surrounding the crucible.

7 Claims, 8 Drawing Sheets

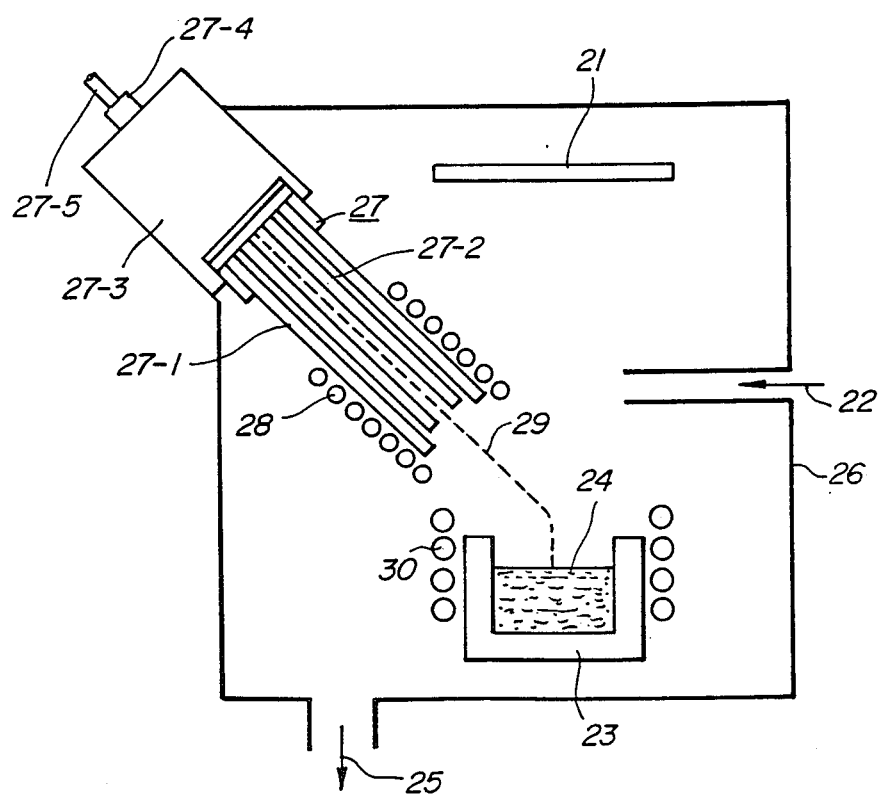
FIG_6

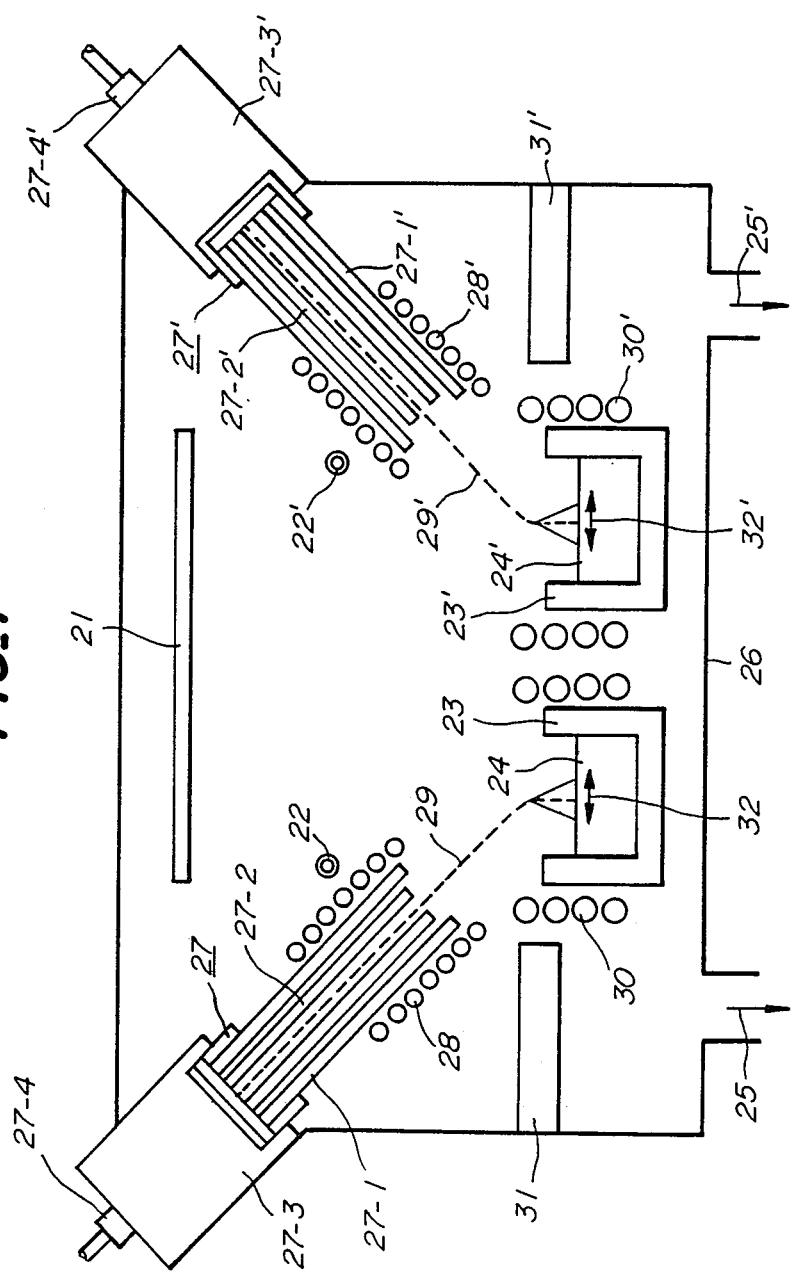

FIG._11a
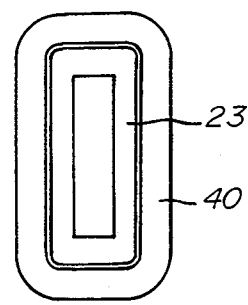
FIG._11b
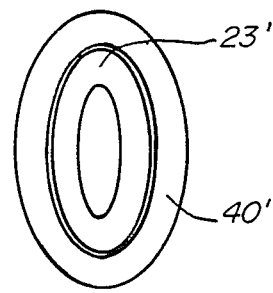
FIG._11c
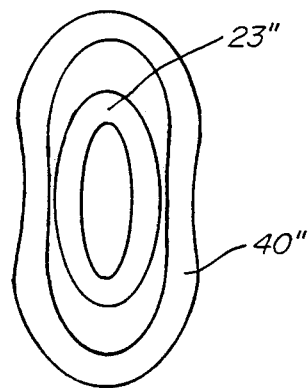

HOLLOW CATHODE GUN AND DEPOSITION DEVICE FOR ION PLATING PROCESS

BACKGROUND OF THE INVENTION

1. Field of the Invention

This invention relates to a hollow cathode gun (hereinafter referred to as HCD gun) used in the ion plating through a hollow cathode discharge (HCD) process, and more particularly to an HCD gun for high ionization and large deposition having good discharge properties and long life as well as a deposition device for iron plating which enables to formation of a deposit film having improved uniformity and bonding property in the ion plating through the HCD gun.

2. Related Art Statement

Ion plating utilizing a plasma is applied to ceramic coating of TiN, TiC, Ti(CN) and the like. As ion plating processes, there are practised HCD process, a combination of EB (electron beam) and RF (radio frequency) processes, the multi-arc process, the arc discharge process and so on. Among these processes, the HCD process is widely utilized for ceramic coating of TiN, TiC, Ti(CN) and the like because the ionization ratio is as high as 20~60% and the film-forming rate is as relatively fast as 0.05~0.5 μm/min. Particularly, the HCD process has an advantage that the ceramic coating can easily and smoothly be carried out even when slightly changing various factors such as flow rate of $N_2$ gas, vacuum degree, bias voltage, substrate temperature, pretreatment of substrate and the like.

Ion plating through the HCD process is elucidated, for example, in Metal Surface Technology, 35[1], pp 16~24 (1984) and Powder and Powder Metallurgy, 32 (1985), pp 55~60.

Since the hollow cathode for plasma generation used at the present in the HCD gun is made from Ta, the durable life per gun is only about 100~150 hours and use exceeding this life is impossible for ceramic coating, so that such a gun is very expensive (400,000~1,000,000 Japanese yen per gun) and accounts for about 30~50% in the coating cost. Therefore, it is desired and demanded to develop a cheap HCD gun capable of stable use over a long period of time.

SUMMARY OF THE INVENTION

It is an object of the invention to provide an HCD gun made from a cheap material and capable of stable use over a long period of time and to provide a bulk deposition device for ion plating which can form a deposit film having improved uniformity and bonding properties by using this HCD gun.

The inventors have previously developed an HCD gun made of graphite instead of the conventional Ta HCD gun in order to reduce the cost of the HCD gun. The graphite HCD gun has merit since its production cost is 1/50~1/100 of the conventional Ta HCD gun, but it does not necessarily satisfy the desired discharge properties and durability.

Now, the inventors have made further studies and experiments with respect to the development of an HCD gun which can realize the reduction of the production cost and the improvement of discharge properties and durability, and have found that a cheap HCD gun having good discharge properties and capable of stable use over a long period of time is obtained by constructing the hollow cathode with an outer layer and an inner layer and properly selecting the materials for each of these layers.

At present, the Ta HCD gun is bent in an inverted L-shape so as to facilitate the beam start of the HCD to cause dissolution of the evaporation substance such as Ti or the like, is mainly used in the ion plating through the HCD process. As a result, when ceramic coating of, for example, TiN is carried out on a substrate, the deposit film becomes undesirably thin on that portion of the substrate which is located just above the HCD gun. And also, an HCD gun of such a bent shape is disadvantageous to make thin due to the collision of the high temperature Ti vapor stream.

Recently, the inventors have developed graphite HCD gun instead of the conventional Ta HCD gun as previously mentioned. However, the graphite HCD gun is not suitable for satisfying the discharge properties required in the HCD gun, particularly stable use over a long period of time though the production cost is reduced to 1/50~1/100 of the conventional one.

The inventors have examined an HCD gun of a concentric double layer, wherein graphite is used as an outer layer and Ta, W or $LaB_6$ is used as an inner layer, and have confirmed that the double layer HCD gun is cheap and has good in the discharge properties and can stably be used over a long period of time.

On the other hand, in the ordinary ion plating apparatus using the conventional HCD gun with a capacity of 300 A or 500 A, the film forming rate is about 0.05~0.5 μm/min, for example, in the Ti coating and the ionization ratio is about 30~40% at most. Lately, in order to raise the film forming rate up to several μm/min, the development of an HCD gun for deposition having a large capacity of about 1,000 A is advanced, whereby the ionization ratio can be increased to not less than 50% and the quality of the deposit film produced through the ion plating can be improved. However, when using such a large capacity HCD gun, there is a danger be caused a that the deposit film becomes unhomogeneous and peels from the substrate.

It is, therefore, another object of the invention to provide a large deposition device for ion plating which solves the above problems even when using an HCD gun having a large capacity of about 1,000 A or more.

The aforementioned objects and other objects of the invention are advantageously achieved by the following features:

According to a first aspect of the invention, there is the provision of a hollow cathode gun for ion plating provided with a hollow cathode applied for deposition and ionization of a substance to be deposited by ion plating through the HCD process, characterized in that said hollow cathode consists of an outer layer made from graphite and an inner layer made from Ta, W or $LaB_6$.

In a preferred embodiment of the first invention, the inner diameter of the outer layer and the outer diameter of the inner layer are gradually reduced toward the top opening of the hollow cathode. In order to improve the discharge properties and of the unit and avoid the incorporation of graphite into plasma atmosphere of the HCD, the hollow cathode consists of an outer graphite layer and an inner Ta, W or $LaB_6$ layer concentrically arranged inside the outer layer at a certain space. Furthermore, a part or a whole of the inner layer is made of a wire.

According to a second aspect of the invention, there is of a deposition device for ion plating through the HCD process comprising at least one crucible housing a substance to be deposited, at least one hollow cathode for generation of plasma and a substrate and a vacuum chamber surrounding them, characterized in that said hollow cathode consists of an outer layer made of a graphite, an inner layer concentrically arranged inside said outer layer at a certain space and made of Ta, W or LaB$_6$ and a focusing coil surrounding the outer periphery of the outer layer and arranged so as to determine an emission of a plasma beam in a slant and downward direction with respect to the substance housed in said crucible, and wherein a focusing coil for deflecting the emitted plasma beam in a normal direction to the surface of said substance housed in said crucible is arranged so as to surround the outer periphery of said crucible to thereby eliminate obstructions to passage of the moving vapor of said substance toward said substrate.

In a preferred embodiment of the second aspect of the invention, a beam wobbling magnetic field generator is further arranged in the vicinity of the crucible to wobble the deflected beam on the surface of the substance housed in the crucible. Further, the focusing coil surrounding the outer periphery of the crucible surrounds the path of movement of the vapor of the substance in a range of from the crucible near to the substrate, or has a diameter gradually increasing from the crucible toward the substrate. Moreover, in order to deposit a large amount of the substance onto a substrate having a large surface area, at least one focusing coil is further arranged so as to surround the outer peripheries of the focusing coils surrounding each of at least two crucibles, and is rectangular, ellipsoidal or peanut-like in shape.

In the deposition device for ion plating, a reaction gas inlet is extended inside the vacuum chamber and provided with a voltage applicable tube to activate the reaction gas.

BRIEF DESCRIPTION OF THE DRAWINGS

The invention will be described with reference to the accompanying drawings, wherein:

FIG. 6 is a schematic view of an embodiment of the batch-type ion plating apparatus according to the invention;

FIG. 7 is a schematic view showing the coating state in a continuous PVD apparatus according to the invention;

FIGS. 10 and 11a~11c are diagrammatic views showing relations between crucible and focusing coil viewed from upside of the apparatus according to the invention, respectively.

DESCRIPTION OF THE PREFERRED EMBODIMENTS

Figure 1A:
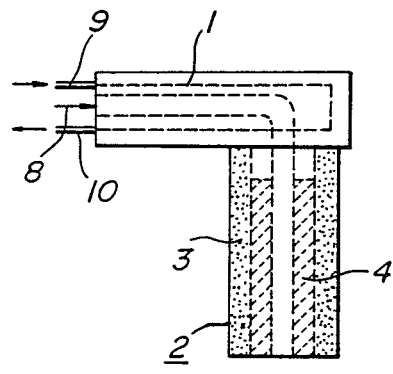
FIGS. 1a and 1b are diagrammatic views illustrating embodiments of HCD guns according to the invention, respectively.
Figure 1B:
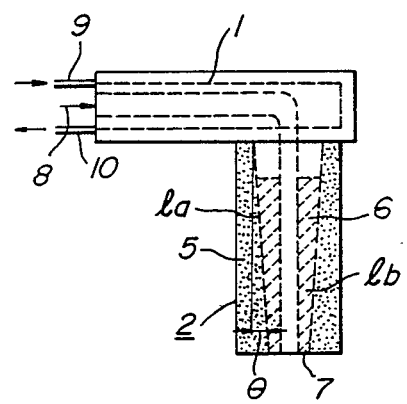

In FIGS. 1a and 1b are shown first and second embodiments of HCD guns according to the invention, respectively.

The HCD gun shown in FIG. 1a comprises an electron gun 1 made of Fe allow and a hollow cathode 2 connected to the front end of the electron gun 1 and consisting of an outer layer 3 made of a graphite and an inner layer 4 made of Ta.

In the HCD gun of FIG. 1b, the hollow cathode 2 consists of an outer graphite layer 5 and an inner Ta layer 6, wherein the inner diameter of the outer layer 5 and the outer diameter of the inner layer 6 are gradually reduced toward a front opening 7 of the hollow cathode 2. That is, as shown in FIG. 1b, the distance between lines la and lb bordering the inner periphery of the outer layer and the outer periphery of the inner layer becomes narrower toward the front opening 7. In this case, it is desirable that the inclination angle $\theta$ of the border line la (lb) is within a range of $0.5° \sim 30°$ in view of the improvement of discharge properties.

Moreover, numeral 8 is an inlet for Ar gas, numeral 9 an inlet for cooling water, and numeral 10 an outlet for cooling water.

The relation of the structure of the hollow cathode in the HCD gun to the durable time and discharge properties was examined by using the following HCD guns (a)~(d). That is, the dissolution of Ti was carried out by passing Ar gas through the hollow cathode in each of these HCD guns at a flowrate of 40 c/min under such conditions that the vacuum degree was $7 \times 10^{-4}$ mmHg, the acceleration voltage was 60 V and the acceleration current was 700 A, during which the durable time and discharge properties of the HCD gun were measured to obtain results as shown in the following Table 1.

Figure 2:
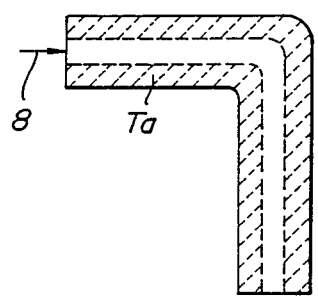
FIGS. 2 and 3 are diagrammatic views of conventional HCD respectively.

(a) HCD gun made of Ta (see FIG. 2)

Figure 3:
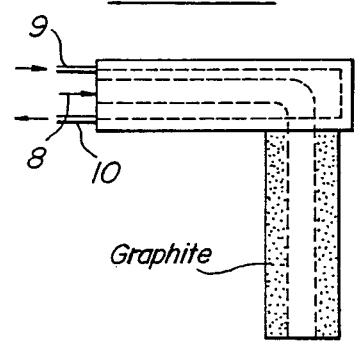

(b) HCD gun provided with a hollow cathode made of a graphite (see FIG. 3)

(c) HCD gun provided with a hollow cathode consisting of an outer graphite layer and an inner Ta layer (see FIG. 1a)

(d) same HCD gun as in the above gun (c) except that the inner diameter of the outer layer and the outer diameter of the inner layer were reduced toward the front opening (see FIG. 1b)

TABLE 1

| | Durable time of HCD gun (hours) | Cost per durable time* | Discharge state | Remarks |
|---|---|---|---|---|
| (a) | 70 | 1 | good | Comparative Example |
| (b) | 30 | 1/100 | problems frequently occurred in discharge properities | Comparative Example |
| (c) | 300 | 1/20 | A gap is produced between graphite and Ta during a long-time use and discharge properties change | Acceptable Example |
| (d) | 300 | 1/20 | good | Acceptable Example |

*(production cost of HCD gun)/(durable time) represented by a ratio when the gun (a) was 1.

As seen from Table 1, the Ta HCD gun (a) has a durable time of 70 hours and a good discharge state, but the cost per the durable time of HCD gun becomes very high. On the other hand, in the graphite HCD gun (b), the durable time is 30 hours, but the cost per durable time is very economical as 1/100. However, the HCD gun (b) is frequently poor in discharge properties as compared with those of the HCD gun (a) and can not stably maintain a good discharge.

On the contrary, in the HCD gun (c) according to the invention, the durable time can largely be prolonged to 300 hours. This is due to the fact that the inner Ta layer is protected by the outer graphite layer and the consumption of Ta due to collision of Ti vapor becomes less and serves to prolong the life of Ta cathode. Moreover, the cost per the durable time in the HCD gun (c) is somewhat higher than that of the HCD gun (b), but is fairly lower than that of the HCD gun (a) and is very economical. The discharge state is good as compared with the case of the HCD gun (b), but a gap is produced between the outer layer and the inner layer during a long period of use to cause the discharge therebetween and consequently the discharge of the HCD gun is liable to become unstable.

In the HCD gun (d) according to the invention, the outer diameter of the inner Ta layer is large in the upper portion and small in the lower portion, so that the bonding property between the outer graphite layer and the inner Ta layer can always be maintained at the same state and the good discharge state can be held even in the long period of use.

However, since the HCD gun (d) is used while a directly applying voltage to the graphite layer, when a plasma atmosphere is formed by the HCD gun, graphite incorporates into this atmosphere and hence C may be included in the resulting deposit film to disadvantageously degrade the film properties.

Figure 4:
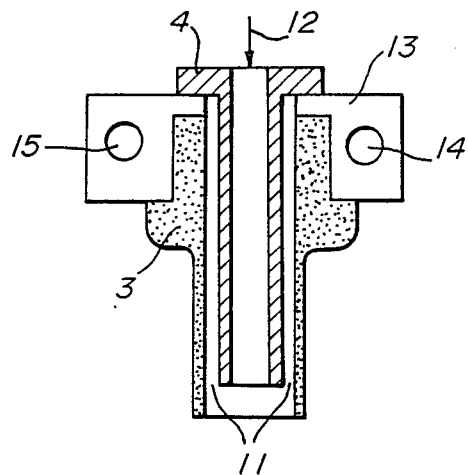
FIGS. 4, 5a and 5b are sectional views illustrating other embodiments of the HCD gun according to the invention, respectively.

As a result of examinations of the latter case, it has been found that an HCD gun having a structure shown, for example, in FIG. 4 is advantageous.

That is, the HCD gun shown in FIG. 4 is characterized in that a space 11 is formed between the inner Ta layer 4 and the outer graphite layer 3. Moreover, numeral 12 is an inlet for argon gas arranged in the center of a base end of the inner layer 4, numeral 13 is a block made of Cu and provided with an inlet 14 and an outlet 15 for cooling water used in the cooling of the inner layer 4.

The relation among the structure, durable time and discharge properties of the hollow cathode according to the invention and the carbon content included in the TiN deposit film (represented by CPS) was examined by the following experiment.

In this experiment, there were used three HCD guns (a)~(c) shown in the following Table 2, i.e. (a) a Ta HCD gun (see FIG. 2), (b) an HCD gun consisting of an outer graphite layer and an inner Ta layer so as to reduce the inner diameter of the outer layer and the outer diameter of the inner layer toward the front opening (see FIG. 1b), and (c) an HCD gun consisting of an outer graphite layer and an inner Ta layer concentrically arranged to the inner periphery of the outer layer at a given distance (see FIG. 4). Ti was dissolved by passing Ar gas through the hollow cathode at a flow rate of 30 cc/min under conditions that the vacuum degree was $10^{-4}$ mmHg, the acceleration voltage was 60 V and the acceleration current was 700 A, while $N_2$ gas was introduced into the ionized plasma atmosphere to deposit a TiN film of 1.5 μm in thickness on the glass substrate.

In this experiment, the durable time and discharge state of the HCD gun and the carbon content in the TiN film were measured by an ion microanalyzer (IMMA) to obtain results as shown in Table 2.

TABLE 2

|  | Durable time of HCD gun (hours) | Cost per durable time* | Discharge state | Carbon content in film by IMMA** | Remarks |
|---|---|---|---|---|---|
| (a) | 60 | 1 | good | 115 CPS | Comparative Example |
| (B) | 100 | 1/8 | Discharge somewhat occurs | 260 CPS | Acceptable Example |
| (C) | 500 | 1/12 | good | 120 CPS | Acceptable Example |

*(production cost of HCD gun)/(durable time) represented by a ratio when the gun (a) was 1.
**carbon content in TiN film analyzed by ion microanalyzer As seen from Table 2, the durable time of the Ta HCD gun (a) is 60 hours (which is shorter than that of Table 1 because the current is 700 A) and the discharge state is good. Furthermore, the analyzed value of carbon content is the TiN film by IMMA is 115 CPS, which is a background and indicates a fact that C is not included in the film.

On the other hand, in the HCD gun (b), the durable time is largely prolonged to 100 hours and hence the life of the cathode is considerably prolonged. However, since the capacity of the HCD gun is as large as 700 A, a some discharge is caused between graphite and Ta, and consequently the analyzed value of carbon content in the TiN film by IMMA is 260 CPS, which indicates that C is included in the film.

In the HCD gun (c), the durable time is further prolonged to 500 hours and also the cost per durable time is largely reduced. Furthermore, there is caused no discharge in use, and the analyzed value of carbon content in the TiN film by IMMA is 120 CPS, which is substantially equal to that of the HCD gun (a) and indicates that C is not included in the film.

Among these large capacity HCD guns, the HCD gun (c) is excellent in discharge properties, deposit film properties, gun life cost and the like as compared with the HCD gun (b) as seen from Table 2. Particularly, in the HCD gun (c), the effect of reducing the consumption with Ta due to the collision of Ti vapor is large because the voltage is not directly applied to the graphite layer and the Ta cathode is protected with the graphite layer.

Figure 5A:
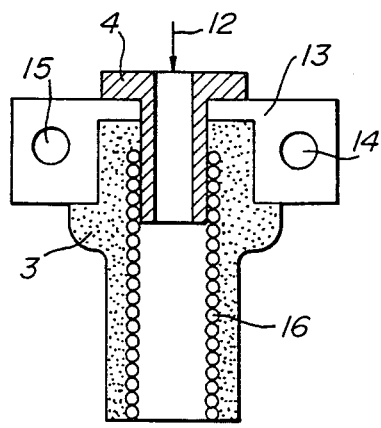
Figure 5B:
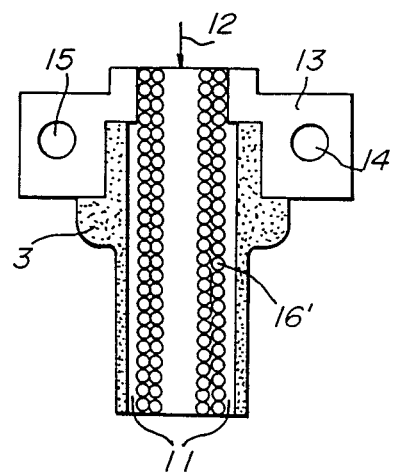

In FIGS. 5a and 5b are schematically shown another embodiments of the HCD gun according to the invention. The HCD gun of FIG. 5a consists of an inner layer 4 made of W, an outer layer 3 made of graphite and a coil 16 made of a hollow W wire and arranged outside the lower portion of the inner layer 4 along the inner periphery of the outer layer 3. On the other hand, the HCD gun of FIG. 5b consists of the outer graphite layer 3 and double coils 16' arranged as an inner layer inside the outer layer through a space 11 and made of a hollow W wire. In these HCD guns, the inside of the gun becomes considerably irregular as compared with the HCD gun of FIG. 4, so that the effective plasma beam can be generated. Furthermore, the production cost becomes cheaper owing to the use of the hollow W wire.

Then, the invention will be described with respect to the deposition device for ion plating using the aforementioned HCD gun.

In FIG. 6 is schematically shown an embodiment of the ion plating apparatus through the HCD process using the deposition device for ion plating according to the invention, wherein numeral 21 is a substrate, numeral 22 an inlet for reaction gas, numeral 23 a crucible, numeral 24 a molten material (e.g. Ti), numeral 25 an exhaust vent for high vacuum drawing, numeral 26 a vacuum chamber, and numeral 27 an HCD gun.

The HCD gun 27 in the illustrated embodiment is a combination of an outer graphite layer 27-1 and an inner Ta layer 27-2 arranged inside the outer layer and separated away therefrom at a given space. Moreover, the inner layer 27-2 and the crucible 23 may be connected to each other by means of a conductor (not shown) in order to prevent the discharge between the outer and inner layers, whereby the abnormal discharge of the HCD gun is reduced to prolong the life of the gun.

Furthermore, the HCD gun 27 is always held at a constant distance to the crucible 23 by means of a feed mechanism 27-3, whereby the supply of stable plasma beam can be ensured over a long period of time. Numeral 27-4 is a power source for the HCD gun and numeral 27-5 an inlet for Ar gas.

Numeral 28 is a focusing coil arranged around the HCD gun 27, which focuses the generated plasma into a fine plasma beam 29. The thus focused fine plasma beam 29 is deflected so as to bend in a direction perpendicular to the surface of the molten material 24 as shown by dotted lines in FIG. 6 by means of a focusing coil 30 arranged around the crucible 23 and acting to change the magnetic field from the up direction to the down direction and the beam is irradiated to the molten material 24. By the irradiation of the perpendicularly oriented plasma beam, the molten material 24 is evaporated directly above, whereby the uniform deposition of the evaporated material to the substrate 21 can be achieved.

Heretofore, the high voltage of 10 kV~2,000 kV has easily been utilized at a low current of not more than 10 mA for bending and wobbling the electron beam. In order to produce a high ionization vapor stream, however, it is advantageous to use the HCD gun at a low voltage and a high current. In this connection, a low voltage of about 10~100 V and a high current of about 1,000~1,500 A become habitually used. Moreover, when using a current higher than the above value, the focusing and bending of the beam become difficult, but the use of such a higher current is made possible by using the two focusing coils as in the invention.

In FIG. 7 is schematically and sectionally shown an embodiment of the continuous PVD equipment for steel sheet coil according to the invention. In this case, the substrate 21 is a steel sheet subjected to ion plating. In this case, an air-to-air system is applied to the steel sheet, wherein the steel sheet is passed through a row of differential pressure chambers having a gradually raised vacuum degree at the entry side of the ion plating zone and through a row of differential pressure chambers having a gradually reduced vacuum degree at the delivery side of the ion plating zone. Thus, the continuous passing of the elongated steel sheet can easily be realized by the above differential pressure sealing system while maintaining the given pressure difference between mutual differential pressure chambers.

On and after FIG. 7, the common parts as in FIG. 6 are represented by the same numerals and similar parts are represented by affixing apostrophe to the numeral. In FIG. 7, numerals 31 and 31' are beam wobbling magnetic field generators, respectively, which deflect the plasma beams 29 and 29' in arrow directions 32 and 32' at about 1~500 Hz to wobble them at high speed, whereby the plasma beam is irradiated to the surface of the molten material over a wide area. As a result, the vapor stream can be produced over a large surface area to uniformly deposit the evaporated material onto the whole surface of the steel sheet, whereby uniform ion plating is possible to apply to the surface of wide steel sheet.

Figure 8:
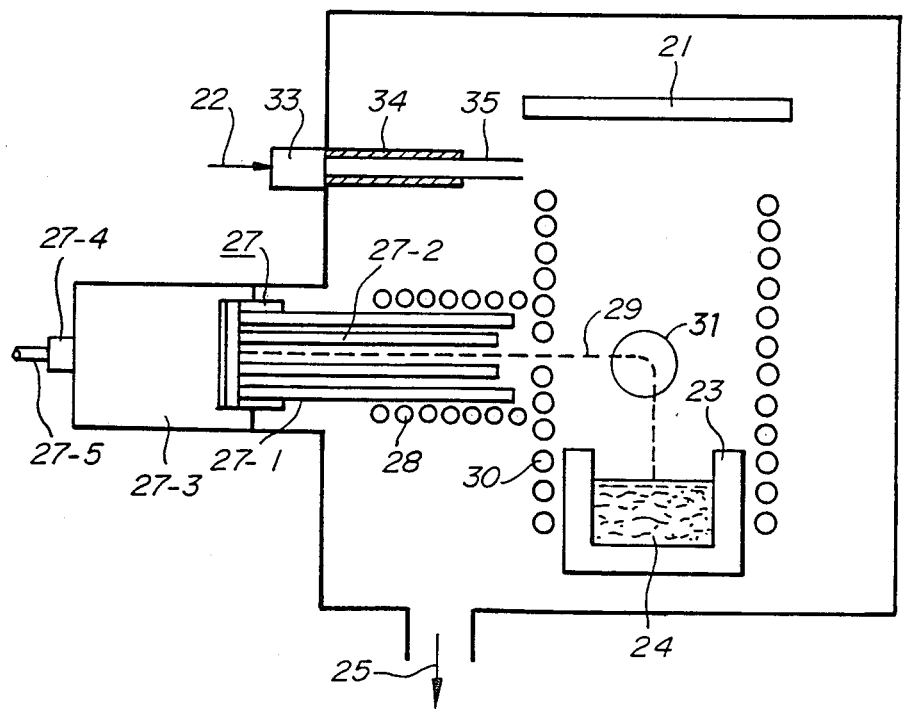
FIG. 8 is a schematic view of another embodiment of a batch-type ion plating apparatus according to the invention.

FIG. 8 shows a modified embodiment of the apparatus shown in FIG. 6, wherein the focusing coil 30 extends near to and end of a reaction gas tube 35. In this case, the dissolved and ionized material from the HCD gun goes straight toward the substrate 21 and hence the deposition efficiency can considerably be increased. Moreover, the beam wobbling magnetic field generator 31 as shown in FIG. 7 may be used. Numeral 33 is a voltage applying device for the reactioN gas provided with a cooling tube 34 and a Ta tube 35. The ionization of the reaction gas can be accelerated by applying voltage to the tube 35.

As a method for promoting the ionization of reaction gas, it is possible to ionize a vapor through the HCD process instead of the use of the reaction gas tube 35. In this HCD process it is preferable to diffuse the HCD beam in the form of sheet for the ionization of a vapor. Moreover, the capacity of the HCD beam may be about $\frac{1}{4}$~1/10 of the plasma beam 29.

Figure 9:
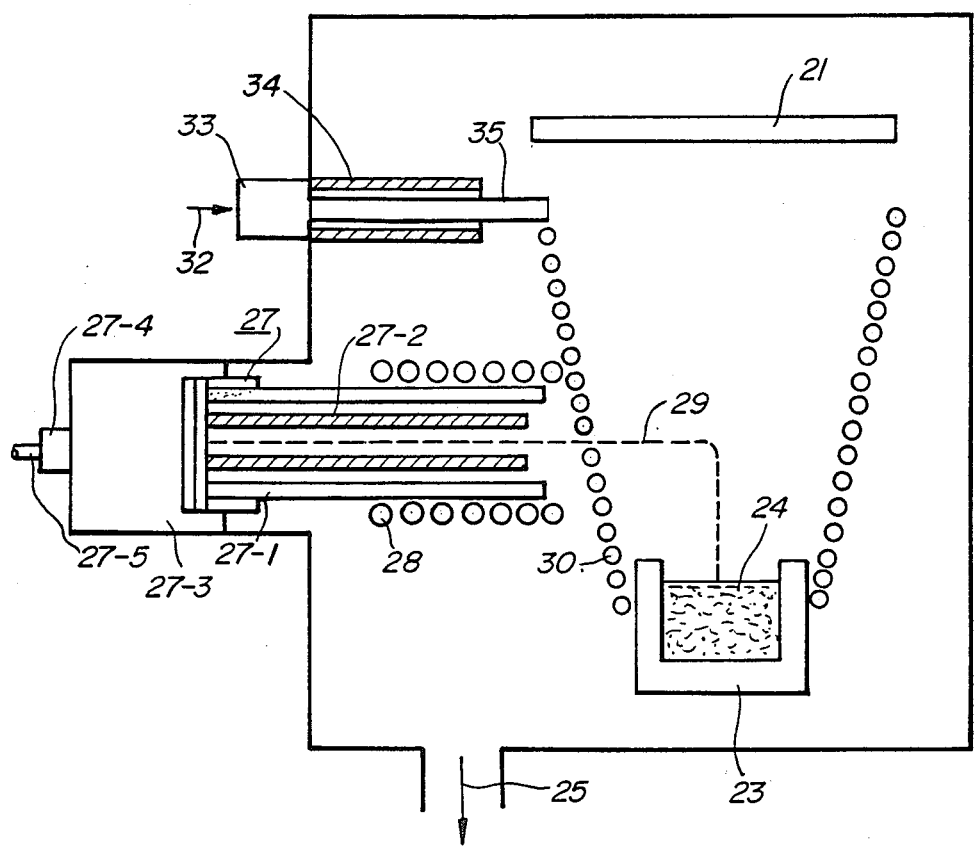
FIG. 9 is a schematic view of another embodiment of a batch-type ion plating apparatus according to the invention.

FIG. 9 shows a further modified embodiment of the apparatus shown in FIG. 8, wherein the shape of the focusing coil 30 is changed. That is, in the focusing coil 30 of FIG. 9, the coil diameter is gradually increased from the vicinity of the crucible 33 toward the vicinity of the end of the reaction gas tube 35, whereby the vapor stream can effectively be deposited onto the substrate having a larger surface area.

In this case, it is also possible to ionize vapor through HCD process instead of the reaction gas tube 35 as a method for promoting the ionization of reaction gas.

Figure 10:
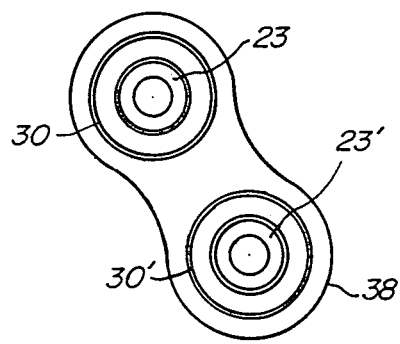

FIG. 10 schematically shows a modified embodiment in the arrangement of the crucible and focusing coil of FIG. 9 viewed from the upper face of the apparatus for effectively depositing the vapor stream to the large surface area of the substrate. In this case, two crucibles 23 and 23' are used for uniform deposition to the substrate. For this purpose, another large focusing coil 38 is arranged around the two focusing coils 30 and 30' surrounding each of these crucibles 23 and 23'.

In FIGS. 11a to 11c are shown other arrangements of crucible and focusing coil for effectively and uniformly depositing the vapor stream to the large surface area of the substrate. That is, FIG. 11a shows a rectangular crucible 23 surrounded by a rectangular focusing coil 40, and FIG. 11b shows an ellipsoidal crucible 23' surrounded by an ellipsoidal focusing coil 40', and FIG. 11c shows an ellipsoidal crucible 23' surrounded by a peanut-like shaped focusing coil 40".

In an aforementioned apparatuses, the plasma generating conditions through the HCD gun are an acceleration voltage of 50~100 V, a current of 500~5,000 A and a bias voltage of 20~150 V, and the substrate temperature is 300°-800° C., and further the excitation conditions of the focusing coils 28 and 30 are 1~30 V and 100~1,000 A.

Figure 12:
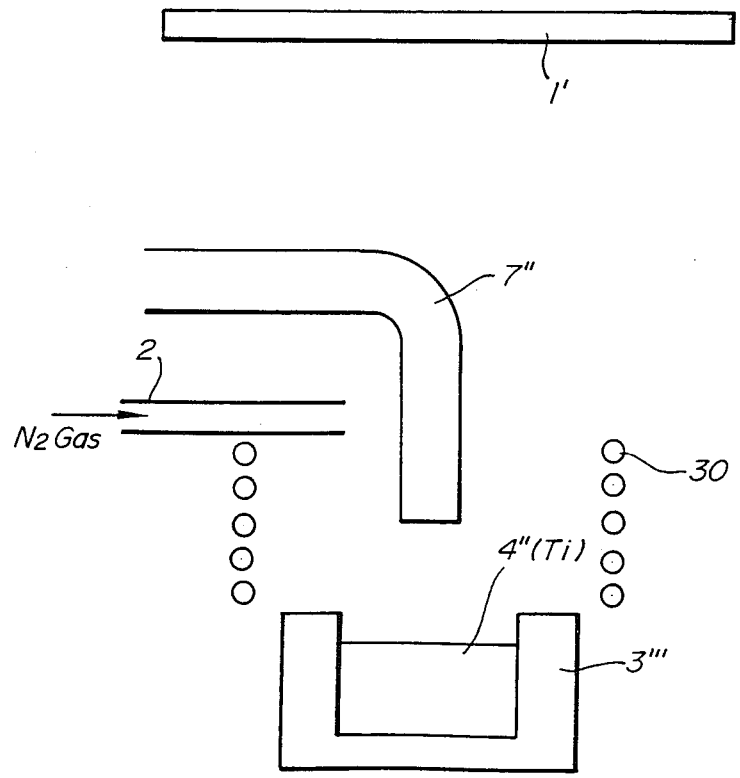
FIG. 12 is a schematic view of the an plating apparatus using a conventional Ta HCD gun.

In FIG. 12 is diagrammatically shown a conventional deposition device using the inverted L-shape HCD gun. In this case, the gun is located in the moving passage of the vapor stream, so that the film deposited on a portion of the substrate facing the gun becomes non-uniform as previously mentioned.

The following examples are given in illustration of the invention and are not intended as limitations thereof.

EXAMPLE 1

The formation of TiN deposit film was carried out by using the HCD gun of FIG. 1b, whose hollow cathode consisting of an outer graphite layer and an inner layer made from (a) Ta, (b) W or (c) $LaB_6$, under a vacuum degree of $8 \times 10^{-4}$ mmHg to obtain results of durable time and discharge state as shown in the following Table 3. In this case, the acceleration voltage and current of the HCD gun were 70 V and 1,000 A, and the flow rate of Ar gas in the hollow cathode was 35 cc/min.

TABLE 3

|   | Durable time of HCD gun (hours) | Cost per durable time* | Discharge state |
|---|---|---|---|
| (a) | 200 | 1 | good and no problem |
| (b) | 200 | ½ | " |
| (c) | 600 | ½ | " |

*(production cost of HCD gun)/(durable time) represented by a ratio when the gun (a) was 1.

EXAMPLE 2

The formation of CrN deposit film was carried out by using the HCD gun of FIG. 4, whose hollow cathode consisting of an outer graphite layer and an inner layer concentrically arranged at a space and made from (a) Ta, (b) W or (c) $LaB_6$, under a vacuum degree of $9.5 \times 10^{-4}$ mmHg to obtain results of durable time and discharge state as well as C content in the CrN film analyzed by IMMA as shown in the following Table 4. In this case, the acceleration voltage and current of the HCD gun were 60~65 V and 1,000 A, and the flow rate of argon gas was 35 cc/min.

TABLE 4

|   | Durable time of HCD gun (hours) | Discharge state | Carbon content in film by IMMA** |
|---|---|---|---|
| (a) | 400 | good | 120 CPS |
| (b) | 600 | " | 125 CPS |
| (c) | 1,000 | " | 115 CPS | analytical value of carbon content in CrN film by ion microanalyzer

EXAMPLE 3

A slab of silicon steel containing C: 0.042%, Si: 3.32%, Mn: 0.062%, Mo: 0.013%, Se: 0.019% and Sb 0.023% was hot rolled to a thickness of 1.8 mm, which was subjected to a cold rolling two times through an intermediate annealing at 950° C. to obtain a final cold rolled sheet of 0.20 mm in thickness.

After decarburization and primary recrystallization annealing was carried out in a wet hydrogen atmosphere at 820° C., the steel sheet surface was coated with a slurry of an annealing separator consisting of MgO (35%), $Al_2O_3$ (60%), $TiO_2$ (3%) and $MgSO_4$ (2%), which was then subjected to a secondary recrystallization annealing at 850° C. for 50 hours and further to a purification annealing in a dry hydrogen atmosphere at 1,200° C. for 5 hours.

After an oxide layer was removed from the steel sheet surface by pickling, the surface was rendered into a mirror state having a center-line average roughness of Ra=0.05 μm by electrolytic polishing.

Then, a TiN deposit film of 1 μm was formed by using the ion plating apparatus shown in FIGS. 6 and 8.

In this case, the plasma generating conditions were acceleration voltage and current of 70 V and 1,000 A, while the excitation conditions of the focusing coils 28 and 30 were shown in the following Table 5. Moreover, the bias voltage was 100 V and the substrate temperature was 400° C., while the generation state of HCD beam and evaporation rate were shown in Table 5. And also, the magnetic properties of the resulting product, uniformity of TiN film and adhesion property are shown in Table 5.

TABLE 5

|   | Kind of ion plating apparatus | Condition of focusing coil surrounding HCD gun | Condition of focusing coil surrounding crucible | Generation state of beam | Evaporation rate (μm/min) | Ununiformity of film** | Magnetic properties $B_{10}(T)$ | $W_{17/50}$ (W/kg) | Adhesion property* |
|---|---|---|---|---|---|---|---|---|---|
| 1 |   | 2.0 V, 400 A | no use | no deposition due to discontinuity of beam | — | — | — | — | — |
| 2 | use of apparatus shown in FIG. 6 | no use | 2.0 V, 300 A | no deposition due to discontinuity of beam | — | — | — | — | — |
| 3 |   | 2.0 V, 400 A | 2.0 V, 300 A | depositable | 1.8 | ±30% | 1.92 | 0.71 | Δ |
| 4 | use of apparatus shown in FIG. 8 | 2.0 V, 400 A | no use | no deposition due to discontinuity of beam | — | — | — | — | — |
| 5 | (50 V, 60 A applied to reaction gas tube) | no use | 2.0 V, 300 A | no deposition due to discontinuity of beam | — | — | — | — | — |

TABLE 5-continued

| Kind of ion plating apparatus | Condition of focusing coil surronding HCD gun | Condition of focusing coil surrounding crucible | Generation state of beam | Evaporation rate (μm/min) | Ununiformity of film** | Magnetic properties | | Adhesion property* |
|---|---|---|---|---|---|---|---|---|
| | | | | | | $B_{10}$(T) | $W_{17/50}$ (W/kg) | |
| 6 | 2.0 V, 400 A | 2.0 V, 300 A | depositable | 3.2 | ±20% | 1.92 | 0.66 | |

*peeling when bending the sheet at a diameter of 10 mm by 180°
 no peeling
 Δ somewhat peeling
**uniformity of TiN film was evaluated on the surface of steel sheet specimen of 0.20 × 150 × 300 mm As seen from Table 5, the magnetic properties, uniformity of TiN film and adhesion property are excellent at the conditions 3 and 6, particularly condition 6 according to the invention.

EXAMPLE 4

A coil (0.7 mm thickness, 10 t) of a low carbon cold rolled steel sheet containing C: 0.043%, Mn: 0.35%, S: 0.012% and P: 0.008% was rendered into a mirror state having a center-line average roughness of Ra=0.1 μm by electrolytic polishing, and then subjected to an ion plating of TiN (thickness of TiN: 2.0 μm) by using the continuous PVD apparatus according to the invention (FIG. 7). In this case, the plasma generating conditions were acceleration voltage and current of 72 V and 1,000 A, bias voltage of 80 V and substrate temperature of 350° C. The excitation conditions of the focusing coils 28, 28', 30 and 30', operating conditions of the beam wobbling magnetic field generator 31, generation state of HCD beam, and uniformity and adhesion property of TiN film on the steel sheet surface after the ion plating are shown in the following Table 6.

TABLE 6

| | Condition of focusing coil surronding HCD gun | Condition of focusing coil surronding crucible | Generation state of HCD beam | Beam wobbling magnetic field generation | Ununiformity for TiN film** | Adhesion property* |
|---|---|---|---|---|---|---|
| 1 | 2.0 V, 350 A | no use | no deposition due to discontinuity of beam | no use | — | — |
| 2 | no use | 2.0 V, 300 A | no deposition due to discontinuity of beam | no use | — | — |
| 3 | 2.0 V, 350 A | 2.0 V, 300 A | depositable | no use | ±25% | Δ |
| 4 | 2.0 V, 350 A | 2.0 V, 300 A | depositable | 20 Hz | ±15% | |

*peeling when repeating the reciprocative bending of 180° at five times
 no peeling
 Δ somewhat peeling
**uniformity of TiN film in widthwise direction of the sheet of 0.20 × 500 × 1 mm was evaluated in the continuous PVD apparatus As seen from Table 6, the uniformity and adhesion property of the deposit film are considerably excellent at the conditions 3 and 4, particularly condition 4 according to the invention.

As mentioned above, according to the first aspect of the invention, there can be provided an HCD gun being cheap in the production cost and having improved discharge properties and durability. Furthermore, according to the second aspect of the invention, deposit films having a good uniformity and an excellent adhesion property can be formed with a high efficiency by the ion plating through HCD process.

What is claimed is:

1. A hollow cathode gun for ion plating provided with a hollow cathode applied for deposition and ionization of a substance to be deposited by ion plating through the HCD process, characterized in that said hollow cathode consists of an outer layer made from graphite and an inner layer comprising a material selected from the group consisting of Ta, W and LaB$_6$, wherein a part or the whole of said inner layer is in the form of a wire.

2. A deposition device for ion plating through the HCD process comprising at least one crucible arranged to carry a substance to a deposited, at least on e hollow cathode for generation of plasma and a substrate and a vacuum chamber surrounding them, characterized in that said hollow cathode comprises an outer layer made of graphite, an inner layer concentrically arranged inside said outer layer and spaced therefrom, said inner layer comprising a material selected from the group consisting of Ta, W and LaB$_6$ wherein a part or the whole of said inner layer is in the form of a wire, a focusing coil surrounding the outer periphery of the outer layer and arranged so as to guide the emission of the plasma beam along an inclined and downward direction with respect to the substance housed in said crucible, and another focusing coil arranged for deflecting the emitted plasma beam in a direction normal to the surface of said substance housed in said crucible, said other focusing coil being arranged in surrounding relationship to the outer periphery of said crucible, and a beam wobbling magnetic field generator arranged in the vicinity of the crucible and controlled to wobble the deflected beam on the surface of the substance housed in the crucible to thereby eliminate obstructions between said substance and said substrate, wherein said focusing coil surrounding the outer periphery of the crucible surrounds the path of movement of the vapor of the substance and extends in a range extending from the crucible to a location near the substrate.

3. The deposition device according to claim 2, wherein said focusing coil surrounding the outer periphery of said crucible has a diameter which gradually increases from the crucible toward the substrate so as to surround the path of movement of the vapor of the substance and extends in a range from the crucible to a location near the substrate.

4. The deposition device according to claim 2, wherein said substance is contained in at least two crucibles and at least on focusing coil is further arranged to surround the outer peripheries of the focusing coils surrounding each of said least two crucibles.

5. The deposition device according to claim 2, wherein said focusing coil is rectangular, ellipsoidal or peanut-like shaped.

6. The deposition device according to claim 2, wherein said hollow cathode includes an inlet for reaction gas and wherein said inlet is provided with a voltage applicable tube extending from said inlet and extending into the inside of said vacuum chamber.

7. The deposition device according to claim 2, wherein means are provided for forming a beam of hollow cathode discharge diffused in the form of a sheet, and wherein said beam is protruded into said vacuum chamber for promoting ionization of reaction gas.

* * * * *

UNITED STATES PATENT AND TRADEMARK OFFICE
CERTIFICATE OF CORRECTION

PATENT NO. : 4,863,581

DATED : September 5, 1989

INVENTOR(S) : Yukio Inokuti and Osamu Ohkubo

It is certified that error appears in the above-identified patent and that said Letters Patent is hereby corrected as shown below:

Column 1, line 14, delete "to";
          line 18, delete "a"; and
          line 19, delete "practised" and insert therefor
            --practiced the--.

Column 2, line 14, after "developed" insert --a--;
          line 19, after "time" insert a comma --,--;
          line 25, delete "in the";
          line 39, delete "be caused a";
          line 60, after "and", first occurrence, insert
            --durability--; and
          line 61, after "into" insert --the--; and
          line 68, delete "of" and insert therefor --provided--.

Column 3, line 49, delete "other".

Column 4, line 68, delete "the", second occurrence.

Column 5, line 42, delete "a".

UNITED STATES PATENT AND TRADEMARK OFFICE
CERTIFICATE OF CORRECTION

PATENT NO. : 4,863,581

DATED : September 5, 1989

INVENTOR(S) : Yukio Inokuti and Osamu Ohkubo

It is certified that error appears in the above-identified patent and that said Letters Patent is hereby corrected as shown below:

Column 6, line 43, delete "a".

Column 8, line 10, delete "the";
        line 12, after "affixing" insert --an--; and
        line 40, after "of", first occurrence, insert --a--.

Column 9, line 12, delete "the" and insert therefor --an--.

Column 12, line 16, delete "on e" and insert therefor --one--;
        line 23, after "$LaB_6$" insert a comma --,--.

Column 13, line 3, delete "on" and insert therefor --one--; and
        line 5, after "said" insert --at--.

Signed and Sealed this

Twenty-first Day of July, 1992

Attest:

DOUGLAS B. COMER

*Attesting Officer*      *Acting Commissioner of Patents and Trademarks*